US009899492B2

(12) United States Patent
Yamada et al.

(10) Patent No.: US 9,899,492 B2

(45) Date of Patent: Feb. 20, 2018

(54) COMPOUND SEMICONDUCTOR DEVICE AND METHOD FOR MANUFACTURING THE SAME

(71) Applicant: FUJITSU LIMITED, Kawasaki-shi, Kanagawa (JP)

(72) Inventors: Atsushi Yamada, Isehara (JP); Tetsuro Ishiguro, Kawasaki (JP)

(73) Assignee: FUJITSU LIMITED, Kawasaki (JP)

( * ) Notice: Subject to any disclaimer, the term of this patent is extended or adjusted under 35 U.S.C. 154(b) by 0 days.

(21) Appl. No.: 14/945,807

(22) Filed: Nov. 19, 2015

(65) Prior Publication Data

US 2016/0190278 A1 Jun. 30, 2016

(30) Foreign Application Priority Data

Dec. 26, 2014 (JP) ................................ 2014-265977

(51) Int. Cl.

*H01L 21/388* (2006.01)
*H01L 29/66* (2006.01)
*H01L 29/778* (2006.01)
*H01L 21/02* (2006.01)
*H01L 29/43* (2006.01)

(Continued)

(52) U.S. Cl.

CPC .... *H01L 29/66462* (2013.01); *H01L 21/0254* (2013.01); *H01L 21/0262* (2013.01); *H01L 21/02378* (2013.01); *H01L 21/02458* (2013.01); *H01L 21/02576* (2013.01);

(Continued)

(58) Field of Classification Search

CPC ........... H01L 29/2003; H01L 29/66462; H01L 21/02378; H01L 21/02458; H01L 21/0254; H01L 21/0262; H01L 29/517; H01L 29/66431; H01L 29/7786; H01L 29/7787;

(Continued)

(56) References Cited

U.S. PATENT DOCUMENTS

2008/0197359 A1* 8/2008 Imanishi ........... H01L 21/02378 257/76
2009/0212324 A1* 8/2009 Tamai ............... H01L 29/66431 257/192

(Continued)

FOREIGN PATENT DOCUMENTS

JP 2008-53450 A1 3/2008
JP 2014-179546 A1 9/2014

OTHER PUBLICATIONS

P. Ivo, et al.; "Influence of GaN cap on robustmenss of AlGaN/GaN HEMTs;" Proceedings IEEE International Reliability Physics Symposium; 2009; pp. 71-75 (5 Sheets)/p. 2 of specification.

(Continued)

*Primary Examiner* — Robert Bachner

(74) *Attorney, Agent, or Firm* — Kratz, Quintos & Hanson, LLP

(57) ABSTRACT

A compound semiconductor device includes: an electron transit layer; an electron supply layer formed over the electron transit layer; and a GaN cap layer formed over the electron supply layer, wherein the electron supply layer includes a first layer made of i-type $Al_xGa_{1-x}N$ ($0<x<1$) and a second layer made of i-type $Al_yGa_{1-y}N$ ($x<y\leq1$) and formed over the first layer.

6 Claims, 16 Drawing Sheets

(51) Int. Cl.
*H01L 29/20* (2006.01)
*H01L 29/51* (2006.01)

(52) U.S. Cl.
CPC ........ *H01L 29/432* (2013.01); *H01L 29/7787* (2013.01); *H01L 29/2003* (2013.01); *H01L 29/517* (2013.01)

(58) Field of Classification Search
CPC .. H01L 29/812; H01L 21/02425; H01L 21/02
See application file for complete search history.

(56) References Cited

U.S. PATENT DOCUMENTS

2014/0264451 A1* 9/2014 Ozaki .................. H01L 29/513 257/194
2014/0266441 A1 9/2014 Murase
2015/0083994 A1* 3/2015 Jain ..................... H01L 33/0025 257/13

OTHER PUBLICATIONS

J. W. Chung, et al.; "Effect of Gate Leakage in the Subthreshold Characteristics of AlGaN/GaN HEMTs;" IEEE Electron Device Letters, vol. 29; No. 11; Nov. 2008; pp. 1196-1198 (3 Sheets)/p. 2 of specification.

* cited by examiner 30
33
32
31
34
35
DC
36
37
AC

COMPOUND SEMICONDUCTOR DEVICE AND METHOD FOR MANUFACTURING THE SAME

CROSS-REFERENCE TO RELATED APPLICATION

This application is based upon and claims the benefit of priority of the prior Japanese Patent Application No. 2014-265977, filed on Dec. 26, 2014, the entire contents of which are incorporated herein by reference.

FIELD

The embodiments discussed herein are related to a compound semiconductor device and a method for manufacturing the compound semiconductor device.

BACKGROUND

Nitride semiconductors have properties, such as high saturation electron velocity and wide band gaps. Thus, the use of nitride semiconductors for high-power semiconductor devices with high breakdown voltages has been studied. For example, GaN, which is a nitride semiconductor, has a band gap of 3.4 eV, which is larger than the band gap of Si (1.1 eV) and the band gap of GaAs (1.4 eV). Hence, GaN has a high breakdown field strength. Accordingly, GaN is a highly promising material for high-power semiconductor devices, which operate at high voltages, used in power supplies.

There have been many reports about field-effect transistors, in particular, high electron mobility transistors (HEMTs) serving as semiconductor devices made of nitride semiconductors. For example, among GaN-based HEMTs (GaN-HEMTs), AlGaN/GaN HEMTs including an electron transit layer made of GaN and an electron supply layer made of AlGaN have been receiving attention. In an AlGaN/GaN HEMT, a difference in lattice constant between GaN and AlGaN causes strain in AlGaN. The strain-induced piezoelectric polarization and the spontaneous polarization of AlGaN result in a high-density two-dimensional electron gas (2 DEG). Thus, AlGaN/GaN HEMTs are promising high-breakdown voltage power devices for, for example, high-efficiency switch elements and electric vehicles.

Although nitride semiconductor devices are promising high-breakdown voltage power devices, a gate leakage current increases due to crystal defects of a nitride semiconductor during the high-power operation, which decreases the efficiency and results in unstable performance. To address this problem, there has been proposed a method for suppressing a gate leakage current by forming a GaN cap layer on an AlGaN electron supply layer. However, this method poses a problem in that growth is interrupted because of different optimum growth conditions between AlGaN and GaN, and thus a defect is formed at an interface between the electron supply layer and the cap layer. Therefore, there has been proposed another method for suppressing a gate leakage current by oxidizing a surface of the cap layer through an oxygen plasma treatment. However, this method poses a problem in that a defect is formed in the cap layer because of the oxidation of the surface of the cap layer, which causes, for example, current collapse and degrades the performance of the device.

The followings are reference documents.

[Document 1] P. Ivo et al., "Influence of GaN cap on robustness of AlGaN/GaN HEMTs", in *Proc. IEEE Int. Reliab. Phys. Symp.,* 2009, pp. 71-75, and

[Document 2] J. W. Chung et al., "Effect of gate leakage in the subthreshold characteristics of AlGaN/GaN HEMTs", *IEEE Electron Device Lett.*, vol. 29, no. 11, pp. 1196-1198, November 2008.

SUMMARY

According to an aspect of the invention, a compound semiconductor device includes: an electron transit layer; an electron supply layer formed over the electron transit layer; and a GaN cap layer formed over the electron supply layer, wherein the electron supply layer includes a first layer made of i-type $Al_xGa_{1-x}N$ ($0<x<1$) and a second layer made of i-type $Al_yGa_{1-y}N$ ($x<y\leq 1$) and formed over the first layer.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

DESCRIPTION OF EMBODIMENTS

First Embodiment

This embodiment discloses an AlGaN/GaN HEMT made of a nitride semiconductor as a compound semiconductor device.

FIGS. 1A to 1C and FIGS. 2A and 2B are schematic sectional views illustrating a method for manufacturing an AlGaN/GaN HEMT according to a first embodiment in the order of processes.

Figure 1A:
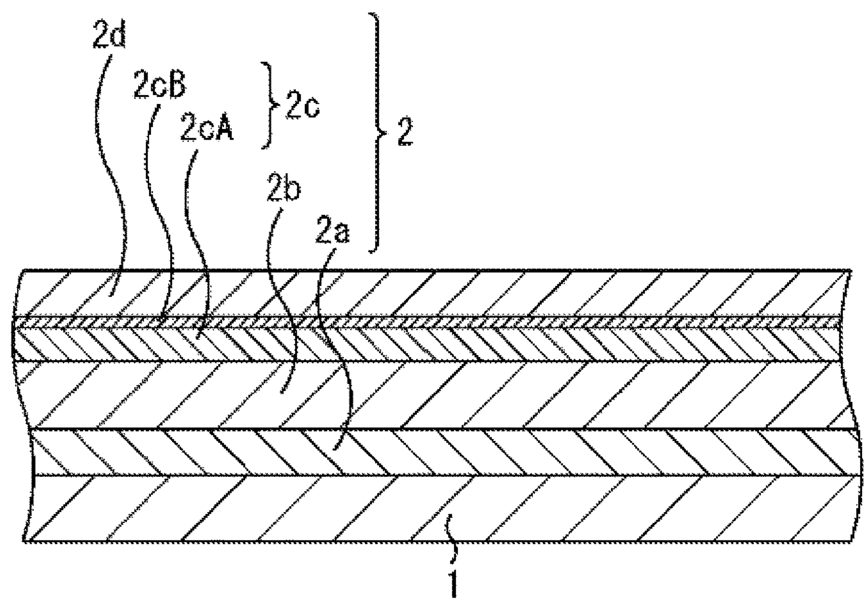
FIGS. 1A to 1C are schematic sectional views illustrating a method for manufacturing an AlGaN/GaN HEMT according to a first embodiment in the order of processes.

First, as illustrated in FIG. 1A, a compound semiconductor multilayer structure 2 is formed over, for example, a SiC substrate 1 serving as a substrate for growth. The substrate for growth may be, for example, a Si substrate, a sapphire substrate, a GaAs substrate, or a GaN substrate, instead of the SiC substrate. The substrate may be a semi-insulating substrate or a conductive substrate.

The compound semiconductor multilayer structure 2 includes a nucleation layer 2*a*, an electron transit layer 2*b*, an electron supply layer 2*c*, and a cap layer 2*d*.

When a completed AlGaN/GaN HEMT is operated, a two-dimensional electron gas (2 DEG) is generated in a portion of the electron transit layer 2*b* near the interface between the electron transit layer 2*b* and the electron supply layer 2*c*. The 2 DEG is generated based on the difference in lattice constant between a compound semiconductor (herein GaN) of the electron transit layer 2*b* and a compound semiconductor (herein AlGaN) of the electron supply layer 2*c*.

Figure 3:
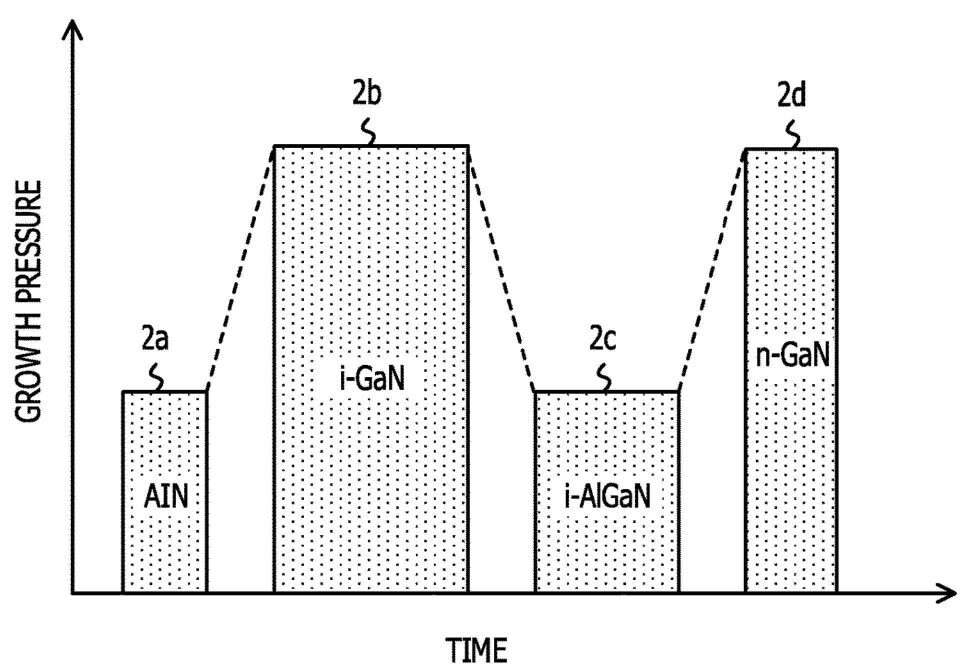
FIG. 3 is a characteristic diagram illustrating a growth pressure sequence used when a compound semiconductor multilayer structure in the AlGaN/GaN HEMT according to the first embodiment is formed.

Specifically, the following compound semiconductors are grown over the SiC substrate 1 by, for example, a metal organic vapor phase epitaxy (MOVPE) method. The MOVPE method is excellent in terms of mass production of compound semiconductors compared with a molecular beam epitaxy (MBE) method or the like. FIG. 3 illustrates a growth pressure sequence of each layer constituting the compound semiconductor multilayer structure 2.

AlN with a thickness of about 30 nm, i (intentionally undoped)-GaN with a thickness of about 3 μm, i-AlGaN with a thickness of about 30 nm, and n-GaN with a thickness of about 10 nm are grown over the SiC substrate 1 in that order. Thus, the nucleation layer 2*a*, the electron transit layer 2*b*, the electron supply layer 2*c*, and the cap layer 2*d* are formed.

The i-AlGaN of the electron supply layer 2*c* is formed such that the concentration of an n-type impurity such as Si, Ge, or Si and Ge is about $1\times10^{17}/cm^3$ or lower, that is, about $1\times10^{15}/cm^3$ in this embodiment in the entire region in the thickness direction thereof. When then-type impurity concentration of the nitride semiconductor is about $1\times10^{17}/cm^3$ or lower, the nitride semiconductor is evaluated to be an i-type semiconductor. When then-type impurity concentration is higher than about $1\times10^{17}/cm^3$, for example, $1\times10^{18}/cm^3$ or higher, the nitride semiconductor is evaluated to be an n-type semiconductor. Agate leakage current is suppressed by forming the electron supply layer 2*c* using i-AlGaN.

When the i-AlGaN of the electron supply layer 2*c* is assumed to be $Al_xGa_{1-x}N$ ($0<x<1$), the i-AlGaN is formed so as to have x=about 0.3 (Al content: 30%). The n-GaN of the cap layer 2*d* is formed such that then-type impurity concentration is higher than about $1\times10^{17}/cm^3$, that is, about $5\times10^{18}/cm^3$ in this embodiment. In the cap layer 2*d*, i-GaN having an n-type impurity concentration of about $1\times10^{17}/cm^3$ or lower may be formed instead of then-GaN.

As illustrated in FIG. 3, the growth interruption (stop of growth gas supply) of MOVPE is caused when the growth process of the i-AlGaN for the electron supply layer 2*c* is shifted to the growth process of the n-GaN for the cap layer 2*d*. Therefore, a second layer 2*c*B made of high-Al-content AlGaN having a composition of i-$Al_yGa_{1-y}N$ ($x<y\leq1$) is formed in a portion of the electron supply layer 2*c* near the interface between the electron supply layer 2*c* and the cap layer 2*d*, that is, in an uppermost portion of the electron supply layer 2*c*. The electron supply layer 2*c* includes a first layer 2*c*A having a composition of i-$Al_xGa_{1-x}N$ ($0<x<1$) and a second layer 2*c*B having a composition of i-$Al_yGa_{1-y}N$ ($x<y\leq1$) (high-Al-content AlGaN) and formed over the first layer 2*c*A. The thickness of the second layer 2*c*B increases as the time of the growth interruption increases. However, when the thickness excessively increases, cracks or the like are formed on the surface and the film quality degrades. Therefore, the second layer 2*c*B is desirably formed so as to have a thickness of about 2 nm or less. In this embodiment, the second layer 2*c*B is formed so as to have a thickness of about 1 nm.

In the growth of the AlN, a mixture gas of trimethylaluminum (TMA) gas and ammonia ($NH_3$) gas is used as a raw material gas. In the growth of the GaN, a mixture gas of trimethylgallium (TMG) gas and $NH_3$ gas is used as a raw material gas. In the growth of the AlGaN, a mixture gas of TMA gas, TMG gas, and $NH_3$ gas is used as a raw material gas. Whether the trimethylaluminum gas serving as an Al source and the trimethylgallium gas serving as a Ga source are supplied and the flow rates of the gases are suitably set in accordance with the compound semiconductor layer grown. The flow rate of the ammonia gas serving as a common raw material is about 100 ccm to 100 LM. The growth pressure is about 50 Torr to 300 Torr and the growth temperature is about 900° C. to 1200° C.

When the n-GaN for the cap layer 2*d* is grown, for example, $SiH_4$ gas containing Si as an n-type impurity is added to a raw material gas at a particular flow rate to dope GaN with Si. The Si doping concentration is about $1\times10^{18}/cm^3$ to about $1\times10^{20}/cm^3$, such as $5\times10^{18}/cm^3$.

Figure 1B:
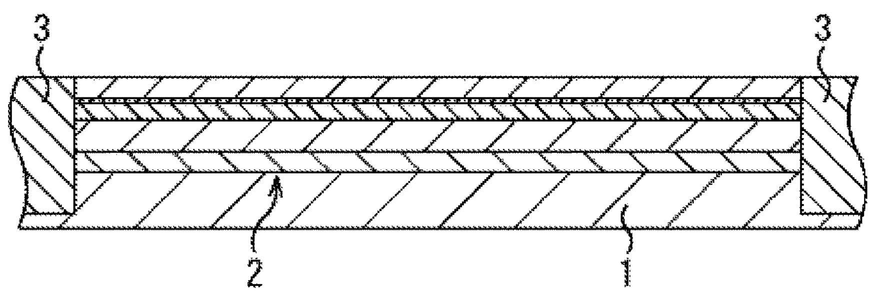

Subsequently, as illustrated in FIG. 1B, an element isolation structure 3 is formed. In the drawings following FIG. 2A, the element isolation structure 3 is not illustrated.

Specifically, for example, argon (Ar) is implanted into an element isolation region of the compound semiconductor multilayer structure 2. Thus, an element isolation structure 3 is formed in the compound semiconductor multilayer structure 2 and a surface layer portion of the SiC substrate 1. The element isolation structure 3 defines an active region on the compound semiconductor multilayer structure 2.

The element isolation may be performed by, for example, a shallow trench isolation (STI) method instead of the above-described implantation method. Herein, the compound semiconductor multilayer structure 2 is dry-etched using, for example, a chlorine-based etching gas.

Figure 1C:
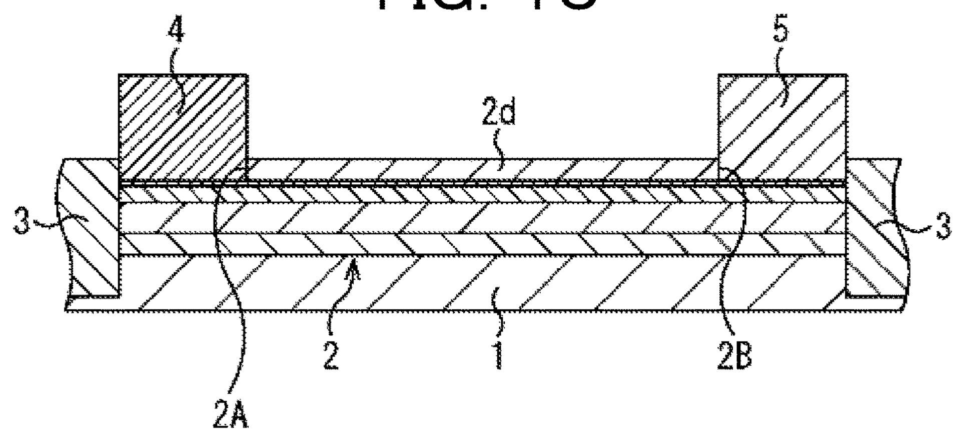

Subsequently, as illustrated in FIG. 1C, a source electrode 4 and a drain electrode 5 are formed.

Specifically, first, electrode recesses 2A and 2B are formed at positions at which a source electrode and a drain electrode are to be formed (positions at which electrodes are to be formed) on the surface of the compound semiconductor multilayer structure 2.

A resist is applied onto the surface of the compound semiconductor multilayer structure 2. The resist is processed by lithography to form openings in the resist, the openings exposing surfaces of the compound semiconductor multilayer structure 2 at the positions at which electrodes are to be formed. Thus, a resist mask having the openings is formed.

Portions of the cap layer 2*d* at the positions at which electrodes are to be formed are removed by being dry-etched using the resist mask until the surface of the electron supply layer 2*c*(that is, the surface of the second layer 2*c*B) is exposed. Thus, electrode recesses 2A and 2B that expose surfaces of the electron supply layer 2*c* at the positions at which electrodes are to be formed are formed. The etching is performed using an inert gas such as Ar gas and a chlorine-based gas such as $Cl_2$ gas as an etching gas under the conditions of, for example, $Cl_2$ flow rate: 30 sccm, pressure: 2 Pa, and RF input power: 20 W. The electrode recesses 2A and 2B may be formed by performing etching to a certain portion of the cap layer 2*d* or to the electron supply layer 2*c* or a layer below the electron supply layer 2*c*. The resist mask is removed by an ashing treatment or the like.

A resist mask for forming a source electrode and a drain electrode is formed. Herein, a two-layer resist with an overhang structure, which is suitable for a deposition method or a lift-off method, is used. This resist is applied onto the compound semiconductor multilayer structure 2, and openings that expose the electrode recesses 2A and 2B are formed. Thus, a resist mask having the openings is formed.

Electrode materials such as Ta/Al (or Ti/Al) are deposited on the resist mask and in the openings that expose the electrode recesses 2A and 2B by, for example, a deposition method using the resist mask. The lower layer is made of Ta and has a thickness of about 20 nm and the upper layer is made of Al and has a thickness of about 200 nm. The resist mask and the Ta/Al deposited thereon are removed by a lift-off method. Then, the SiC substrate 1 is heat-treated at about 400° C. to 1000° C. such as about 550° C. in, for example, a nitrogen atmosphere to form an ohmic contact between the residual Ta/Al and the electron supply layer 2*c*. In the case where an ohmic contact between the Ta/Al and the electron supply layer 2*c* is formed, the heat treatment is not necessarily performed. Thus, a source electrode 4 and a drain electrode 5 are formed so that the electrode recesses 2A and 2B are filled with a portion of the electrode materials.

Figure 2A:
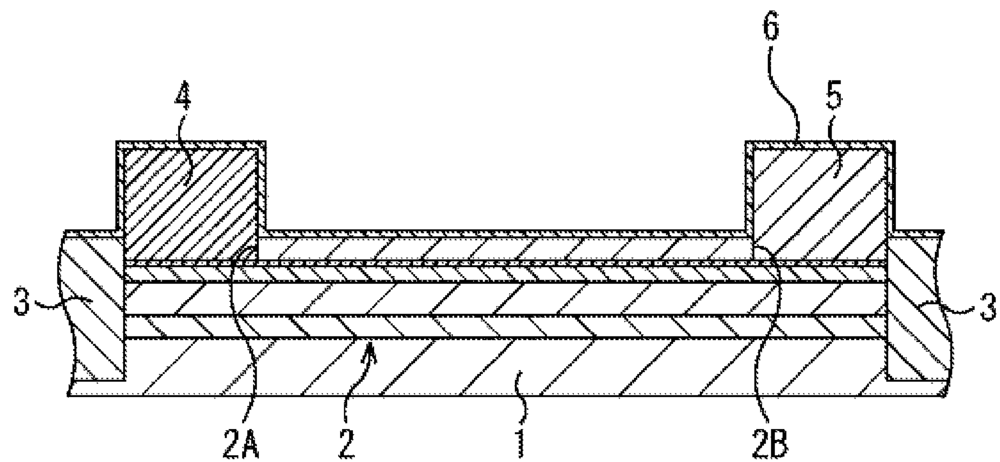
FIGS. 2A and 2B are schematic sectional views following FIGS. 1A to 1C and illustrating the method for manufacturing an AlGaN/GaN HEMT according to the first embodiment in the order of processes.

Subsequently, as illustrated in FIG. 2A, a gate insulating film 6 is formed.

Specifically, an insulating material such as $Al_2O_3$ is deposited so as to cover the compound semiconductor multilayer structure 2. $Al_2O_3$ is deposited by, for example, an atomic layer deposition (ALD) method so as to have a thickness of about 2 nm to 200 nm, about 10 nm herein. Thus, agate insulating film 6 is formed.

Instead of the ALD method, $Al_2O_3$ may be deposited by, for example, a plasma chemical vapor deposition (CVD) method or a sputtering method. Instead of the deposition of $Al_2O_3$, a nitride or oxynitride of Al may be used. Alternatively, a gate insulating film may be formed by using an oxide, nitride, or oxynitride of Si, Hf, Zr, Ti, Ta, or W or by depositing materials suitably selected from the foregoing in a multilayered manner.

Figure 2B:
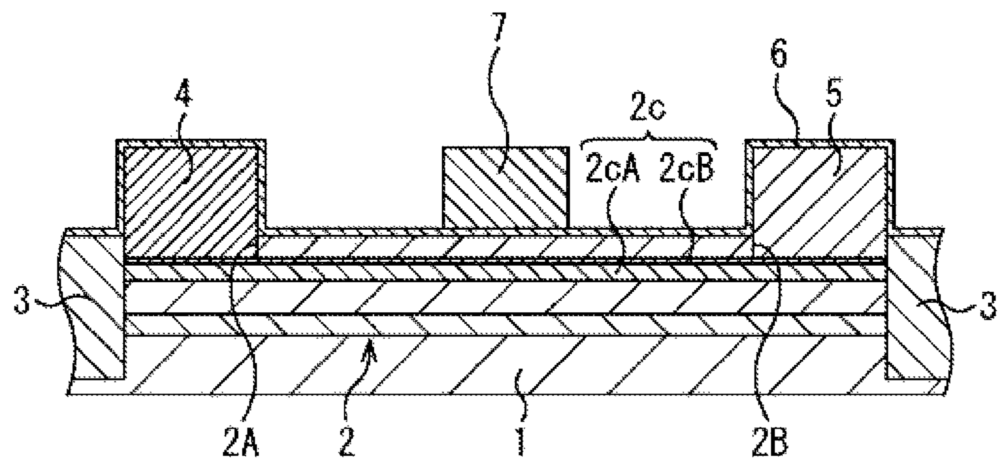

Subsequently, as illustrated in FIG. 2B, a gate electrode 7 is formed.

Specifically, first, a resist mask for forming a gate electrode is formed. Herein, for example, a two-layer resist with an overhang structure, which is suitable for a deposition method or a lift-off method, is used. This resist is applied onto the gate insulating film 6, and an opening that exposes a portion, on the gate insulating film 6, in which a gate electrode is to be formed is formed. Thus, a resist mask having the opening is formed.

Electrode materials such as Ni/Au are deposited on the resist mask and in the opening that exposes the portion, on the gate insulating film 6, in which a gate electrode is to be formed by, for example, a deposition method using the resist mask. The lower layer is made of Ni and has a thickness of about 30 nm and the upper layer is made of Au and has a thickness of about 400 nm. The resist mask and the Ni/Au deposited thereon are removed by a lift-off method. Thus, a gate electrode 7 is formed over the compound semiconductor multilayer structure 2 with the gate insulating film 6 formed therebetween.

In this embodiment, a MIS AlGaN/GaN HEMT including the gate insulating film 6 is exemplified. A Schottky AlGaN/GaN HEMT may be produced in which the gate insulating film 6 is not formed and the gate electrode 7 is directly in contact with the compound semiconductor multilayer structure 2.

Alternatively, a recessed gate structure may be employed in which a recess for a gate electrode is formed in the compound semiconductor multilayer structure 2 and a gate electrode is formed so as to fill the recess.

Then, for example, a step of forming a wiring layer connected to the source electrode 4, the drain electrode 5, and the gate electrode 7 is performed to form an AlGaN/GaN HEMT according to this embodiment.

Hereafter, advantages of the AlGaN/GaN HEMT according to this embodiment will be described.

Figure 4:
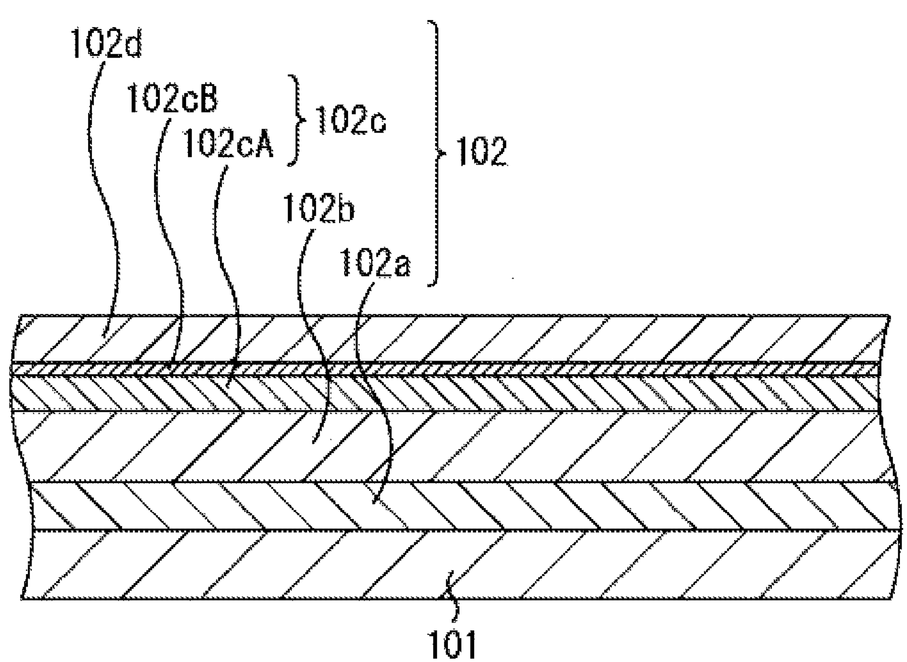
FIG. 4 is a schematic sectional view illustrating a comparative example of the AlGaN/GaN HEMT according to the first embodiment.

An AlGaN/GaN HEMT according to a comparative example of this embodiment will be exemplified. In this comparative example, a typical AlGaN/GaN HEMT is employed which includes a SiC substrate 101 and a compound semiconductor multilayer structure 102 formed thereon as illustrated in FIG. 4. The compound semiconductor multilayer structure 102 includes a nucleation layer 102*a* made of AlN, an electron transit layer 102*b* made of i-GaN, an electron supply layer 102*c* made of n-AlGaN, and a cap layer 102*d* made of n-GaN.

Figure 5:
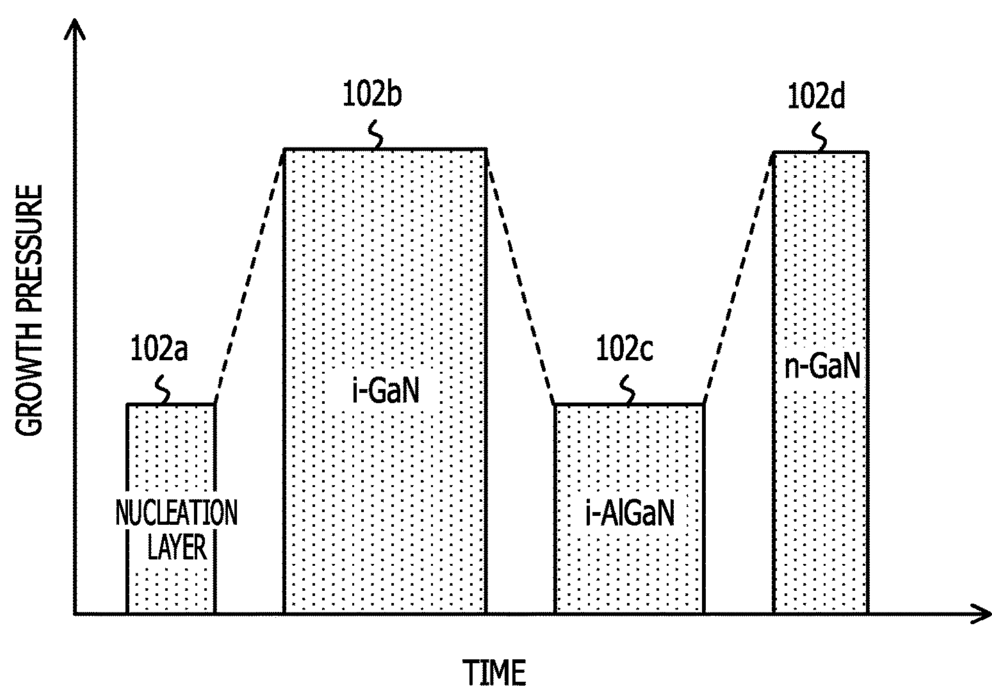
FIG. 5 is a characteristic diagram illustrating a growth pressure sequence used when the compound semiconductor multilayer structure in the AlGaN/GaN HEMT according to the comparative example is formed.

Although a GaN crystal is normally grown by an MOVPE method, the optimum growth pressure is different between GaN and AlGaN. GaN is desirably grown at high pressure to suppress the introduction of impurities, and AlGaN is desirably grown at low pressure to suppress the gas phase reaction of the raw material gas. Therefore, the optimum growth pressure sequence during the formation of the compound semiconductor multilayer structure 102 is a growth pressure sequence illustrated in FIG. 5.

When the growth process of the electron supply layer 102*c* made of n-AlGaN is shifted to the growth process of the cap layer 102*d* made of n-GaN, the growth pressure is changed, which causes growth interruption. The cap layer itself is formed to suppress roughening of the surface of the electron supply layer. As a result of thorough studies conducted by the present inventors, it has been found that, during the growth interruption, Ga at the surface of the electron supply layer 102*c* is detached and a second layer 102*c*B, which is a high-Al-content thin AlGaN layer, is formed in an uppermost portion of the electron supply layer 102*c*. In other words, the electron supply layer 102*c* includes a first layer 102*c*A made of n-AlGaN and the second layer 102*c*B made of n-AlGaN (high-Al-content AlGaN) and formed over the first layer 102*c*A.

Figure 6:
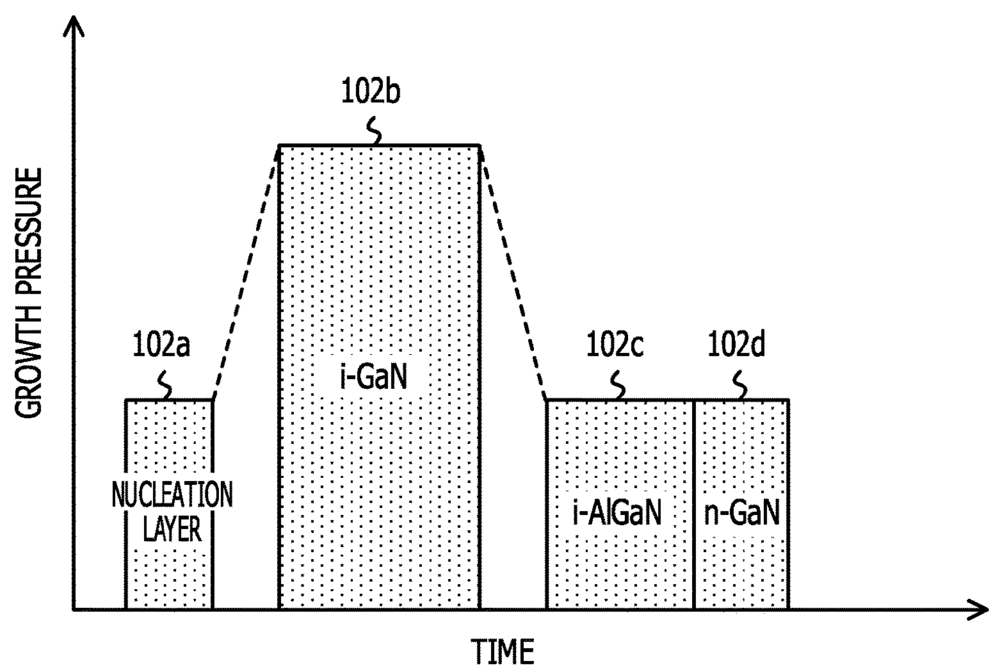
FIG. 6 is a characteristic diagram illustrating a growth pressure sequence used when a compound semiconductor multilayer structure in an AlGaN/GaN HEMT according to another comparative example is formed.

It has been also found that a defect that increases a gate leakage current is present in the second layer 102*c*B. To suppress the formation of the second layer 102*c*B, there is a method for not causing growth interruption by forming the cap layer 102*d* at the same growth pressure as that of the electron supply layer 102*c* as illustrated in FIG. 6. However, this method poses a problem in that the quality of the cap layer 102*d* degrades and current collapse is caused.

In this embodiment, as illustrated in FIG. 1A, the electron supply layer 2*c* is formed of i-AlGaN not containing an n-type impurity. In this structure, the following has been found. The growth pressure is changed between the electron supply layer 2*c* and the cap layer 2*d* to suppress current collapse while maintaining the high quality of the cap layer 2*d*. As a result of the growth interruption caused herein, the second layer 2*c*B is formed in an uppermost portion of the electron supply layer 2*c*. Even if the second layer 2*c*B is formed, the gate leakage current does not increase; on the contrary, it decreases.

Figure 7:
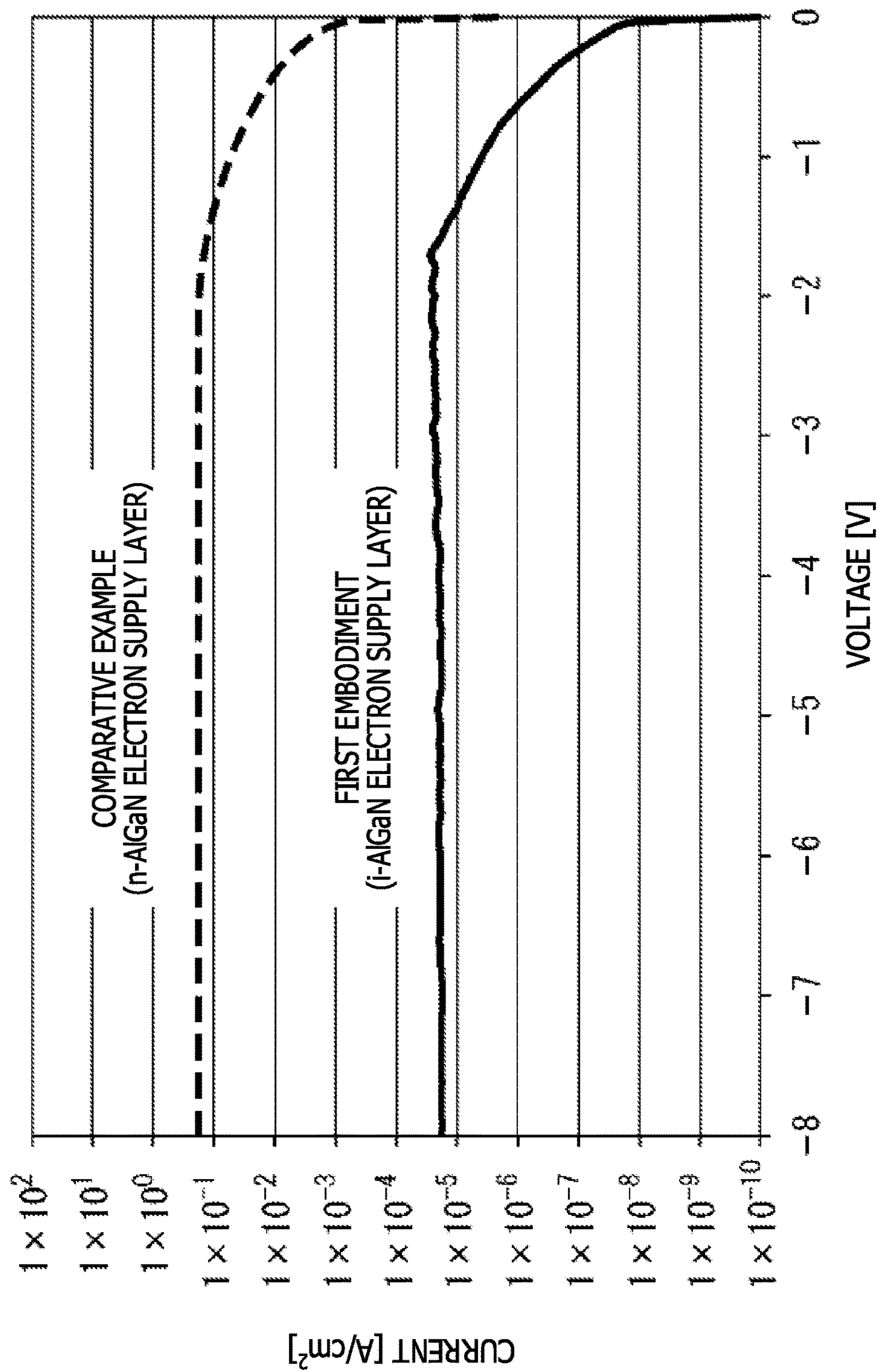
FIG. 7 is a characteristic diagram illustrating the gate leakage characteristics of the AlGaN/GaN HEMT according to the first embodiment and an AlGaN/GaN HEMT including an electron supply layer made of n-AlGaN according to the comparative example.

FIG. 7 is a characteristic diagram illustrating the comparison of gate leakage characteristics between the AlGaN/GaN HEMT including the electron supply layer made of i-AlGaN according to this embodiment and the AlGaN/GaN HEMT including the electron supply layer made of n-AlGaN according to the comparative example.

As is clear from FIG. 7, the gate leakage current in this embodiment significantly decreases compared with the comparative example. In the comparative example, since an n-type impurity having a particular concentration or higher is present in the electron supply layer 102*c*, it is believed that when the second layer 102*c*B made of high-Al-content AlGaN is formed, the n-type impurity is concentrated and thus a defect is formed. In contrast, in this embodiment, the electron supply layer 2*c* is an i-type layer (n-type impurity concentration: $1\times10^{17}/cm^3$ or lower). Even if the second layer 2*c*B made of high-Al-content AlGaN is formed, the n-type impurity is not concentrated and a defect is not formed. In this embodiment, since the electron supply layer 2*c* is an i-type layer, the gate leakage current is decreased as a result of the formation of the second layer 2*c*B. Furthermore, a decrease in carrier density (electron density of 2 DEG) caused when the electron supply layer 2*c* is an i-type layer is sufficiently compensated by the second layer 2*c*B made of high-Al-content AlGaN. This is because the second layer 2*c*B made of high-Al-content AlGaN has larger spontaneous polarization than the first layer 2*c*A made of i-AlGaN and also has large piezoelectric polarization due to the difference in lattice constant from GaN, which increases the density of 2 DEG induced by the electron supply layer.

As described above, this embodiment provides, using a relatively simple structure, a highly reliable AlGaN/GaN HEMT with high breakdown voltages in which both the current collapse and gate leakage current are suppressed with certainty.

Modification

Hereafter, a modification of the first embodiment will be described. This modification discloses the structure and production method of an AlGaN/GaN HEMT as in the first embodiment. This modification is slightly different from the first embodiment in terms of the electron supply layer. The same constituent members as in the first embodiment are designated by the same reference numerals, and the specific descriptions thereof are omitted.

Figure 8A:
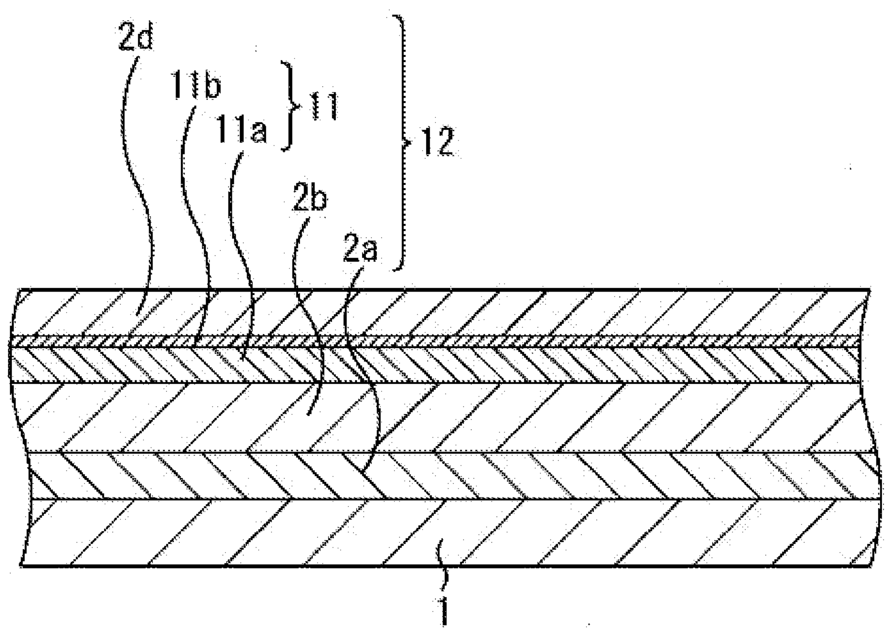
FIGS. 8A and 8B are schematic sectional views illustrating the main steps of a method for manufacturing an AlGaN/GaN HEMT according to a modification of the first embodiment.
Figure 8B:
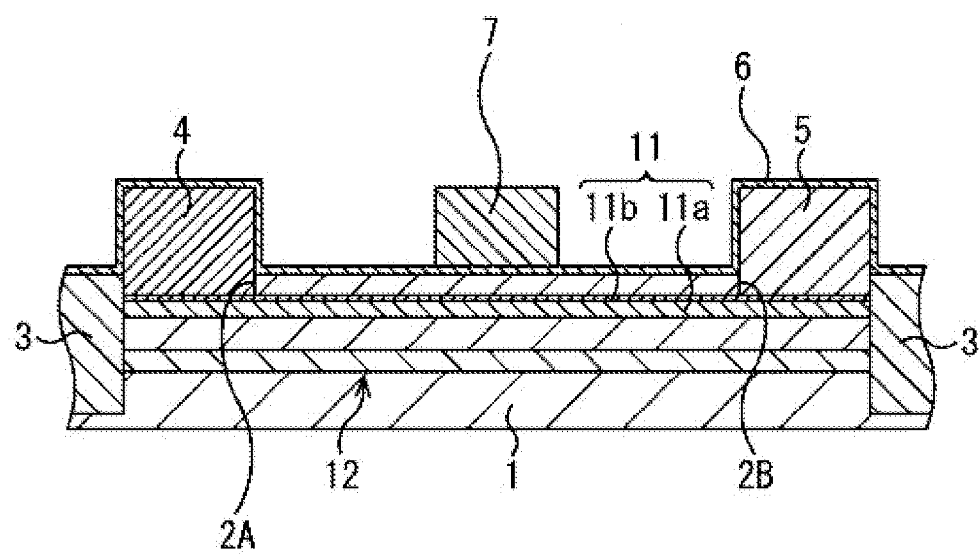

FIGS. 8A and 8B are schematic sectional views illustrating main steps of the method for manufacturing an AlGaN/GaN HEMT according to the modification of the first embodiment.

In this modification, first, as illustrated in FIG. 8A, a compound semiconductor multilayer structure 12 including a nucleation layer 2*a* made of AlN, an electron transit layer 2*b* made of i-GaN, an electron supply layer 11 made of i-AlGaN, and a cap layer 2*d* made of n-GaN stacked in that order is formed over a SiC substrate 1.

The i-AlGaN for the electron supply layer 11 is formed such that the concentration of Si, Ge, or Si and Ge is $1\times10^{17}/cm^3$ or lower, which is an n-type impurity concentration evaluated to be an i-type, in the entire region in the thickness direction. As a result of the growth interruption of MOVPE caused when the growth process of the i-AlGaN for the electron supply layer 11 is shifted to the growth process of the n-GaN for the cap layer 2*d*, a second layer 11*b* made of high-Al-content AlGaN is formed in an uppermost portion of the electron supply layer 11 so as to have a thickness of 2 nm or less, such as about 1 nm. The electron supply layer 11 includes a first layer 11*a* made of i-$Al_xGa_{1-x}N$ ($0<x<1$) and the second layer 11*b* made of i-$AlGa_{1-y}N$ ($x<y\leq1$) (high-Al-content AlGaN) and formed over the first layer 11*a*.

Figure 9:
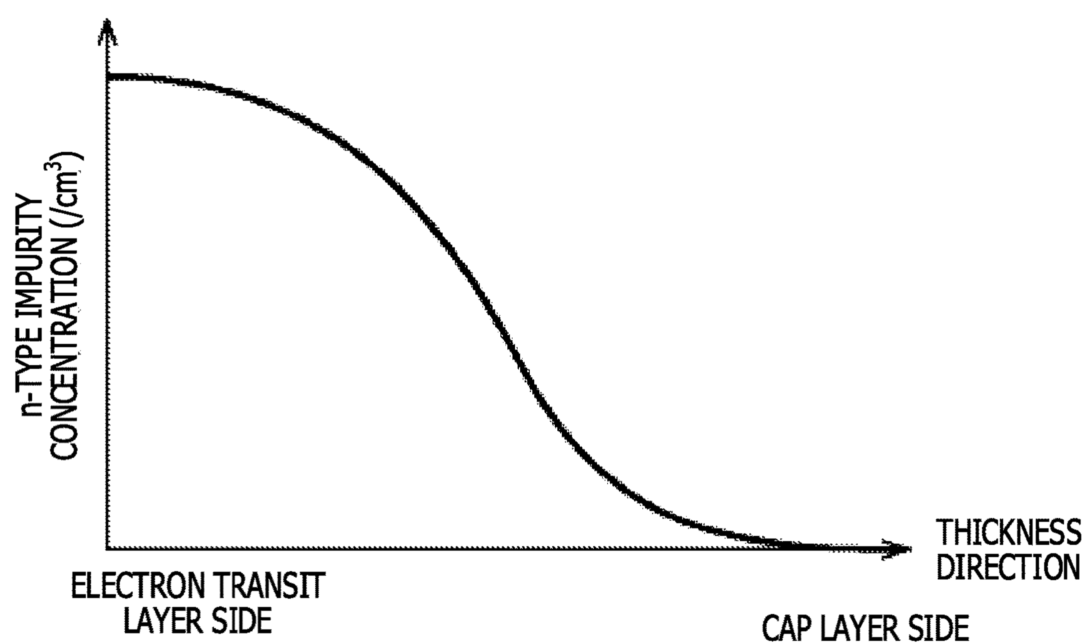
FIG. 9 is a characteristic diagram illustrating a concentration profile of an n-type impurity of the electron supply layer in the AlGaN/GaN HEMT according to the modification of the first embodiment.

In the i-AlGaN for the electron supply layer 11, as illustrated in FIG. 9, the n-type impurity concentration decreases (gradually decreases) in the thickness direction from the electron transit layer 2*b* toward the cap layer 2*d*. In the electron supply layer 11, the n-type impurity concentration of the i-AlGaN is, for example, about $5\times10^{16}/cm^3$ at the interface with the electron transit layer 2*b*, which gradually decreases, and is about $1\times10^{15}/cm^3$ at the interface with the cap layer 2*d*. When the i-AlGaN for the electron supply layer 11 is formed in such a concentration profile of the n-type impurity, the n-type impurity concentration of the i-AlGaN near the interface with the electron transit layer 2*b* is relatively high within the range of $1\times10^{17}/cm^3$ or lower evaluated to be an i-type. Thus, the carrier density, that is, the electron density of 2 DEG is improved.

For example, the following process may be performed to grow the i-AlGaN in the concentration profile of the n-type impurity illustrated in FIG. 9. In the growth performed by MOVPE, for example, $SiH_4$ gas containing Si as an n-type impurity is controlled such that the Si doping concentration gradually decreases from about $5\times10^{16}/cm^3$ to $1\times10^{15}/cm^3$. The thickness of the i-AlGaN for the electron supply layer 11 is about 10 nm or more, such as about 20 nm. FIG. 9 illustrates a concentration profile in which the n-type impurity concentration continuously changes, but the n-type impurity concentration may change stepwise.

Subsequently, the steps illustrated in FIG. 1B to FIG. 2B are performed in the same manner as in the first embodiment to obtain a device illustrated in FIG. 8B. Then, for example, a step of forming a wiring layer connected to the source electrode 4, the drain electrode 5, and the gate electrode 7 is performed to form an AlGaN/GaN HEMT according to this modification.

This modification provides, using a relatively simple structure, a highly reliable AlGaN/GaN HEMT with high breakdown voltages in which both the current collapse and gate leakage current are suppressed with certainty.

Second Embodiment

Hereafter, a second embodiment will be described. This embodiment discloses the structure and production method of an AlGaN/GaN HEMT as in the first embodiment. This embodiment is slightly different from the first embodiment in terms of the electron supply layer. The same constituent members as in the first embodiment are designated by the same reference numerals, and the specific descriptions thereof are omitted.

Figure 10A:
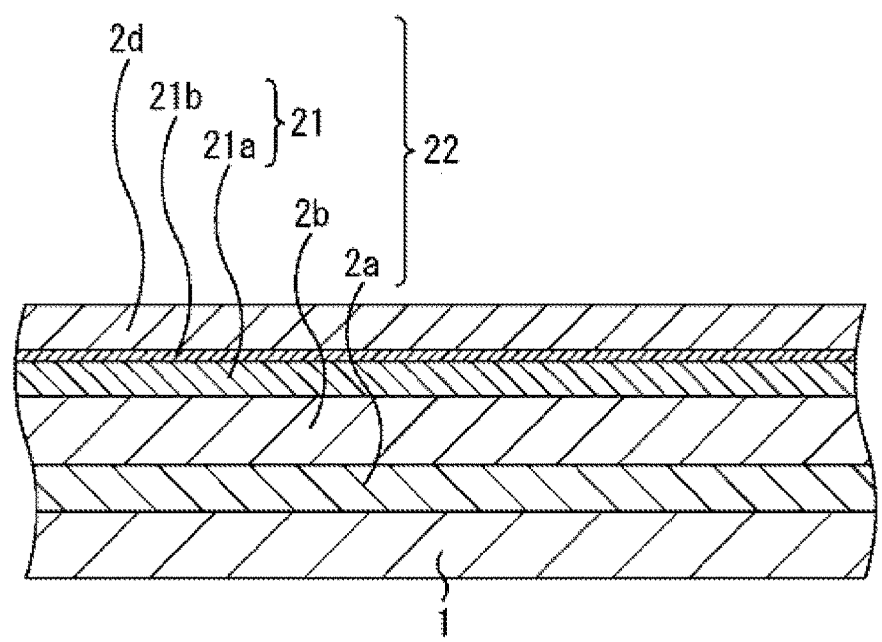
FIGS. 10A and 10B are schematic sectional views illustrating the main steps of a method for manufacturing an AlGaN/GaN HEMT according to a second embodiment.
Figure 10B:
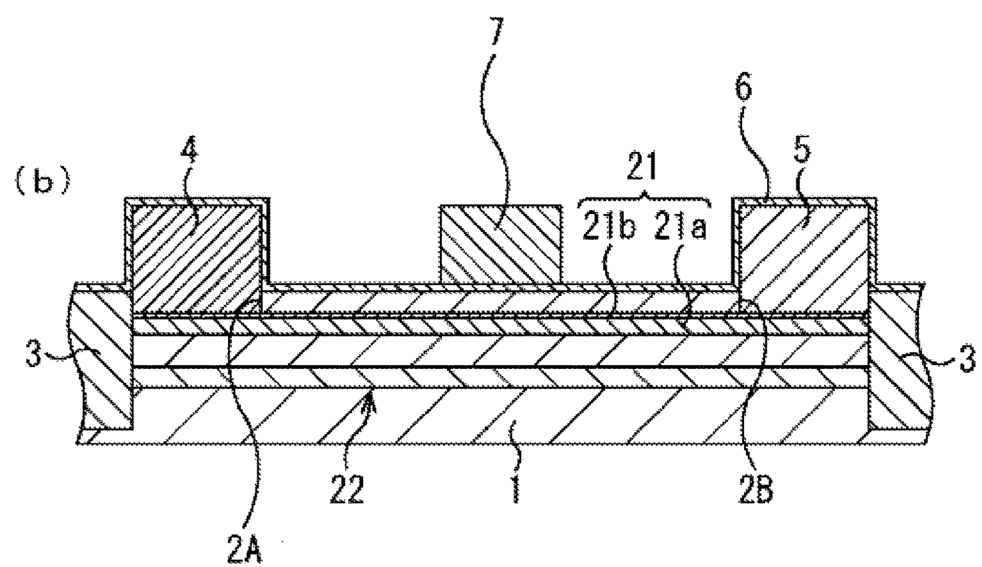

FIGS. 10A and 10B are schematic sectional views illustrating main steps of the method for manufacturing an AlGaN/GaN HEMT according to the second embodiment.

In this embodiment, first, as illustrated in FIG. 10A, a compound semiconductor multilayer structure 22 including a nucleation layer 2*a* made of AlN, an electron transit layer 2*b* made of i-GaN, an electron supply layer 21 made of i-AlGaN, and a cap layer 2*d* made of n-GaN stacked in that order is formed over a SiC substrate 1.

In the electron supply layer 21, the n-type impurity concentration is $1\times10^{17}/cm^3$ or lower, which is an n-type impurity concentration evaluated to be an i-type, in the entire region in the thickness direction. The electron supply layer 21 includes a first layer 21*a* made of i-$Al_xGa_{1-x}N$ ($0<x<1$) and a second layer 21*b* formed over the first layer 21*a* and made of $Al_yGa_{1-y}N$ ($x<y\leq1$), herein i-AlN ($y=1$). This embodiment is different from the first embodiment in that, in the growth process of the electron supply layer 21, the first layer 21*a* is grown and then the second layer 21*b* is grown without interruption. The first layer 21*a* is formed so as to have x=about 0.3 (Al content: 30%) and a thickness of about 30 nm. The second layer 21*b* is formed so as to have a thickness of about 2 nm or less, herein about 1 nm.

Figure 11:
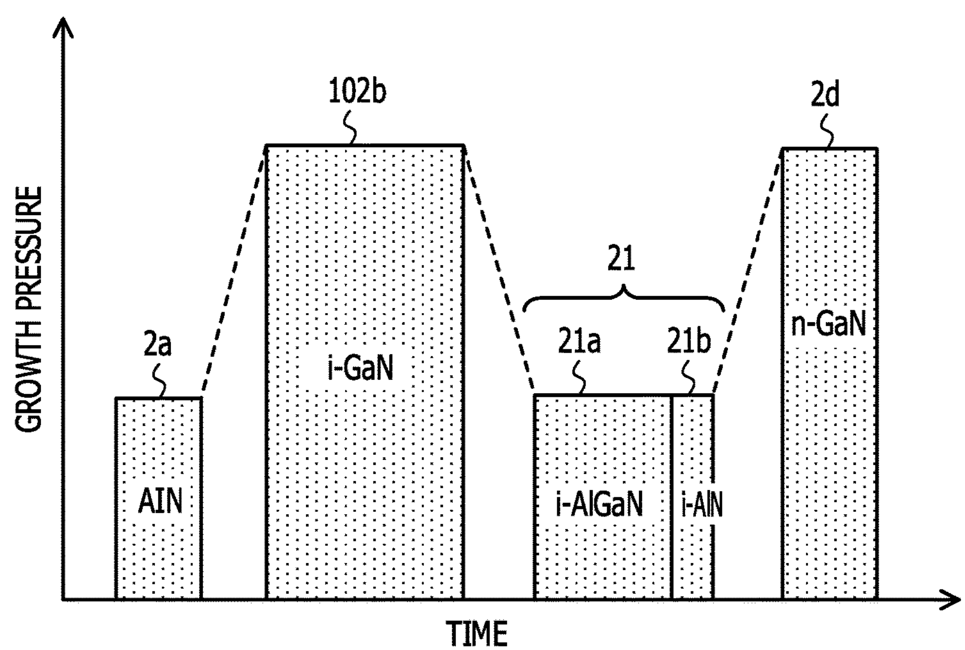
FIG. 11 is a characteristic diagram illustrating an optimum growth pressure sequence used when a compound semiconductor multilayer structure in the AlGaN/GaN HEMT according to the second embodiment is formed.

FIG. 11 is a characteristic diagram illustrating an optimum growth pressure sequence used when the compound semiconductor multilayer structure 22 is formed.

In this embodiment, the growth pressure is different between the growth of AlN for the nucleation layer 2*a* and the growth of i-GaN for the electron transit layer 2*b*, between the growth of i-GaN for the electron transit layer 2*b* and the growth of i-AlGaN for the first layer 21*a*, and between the growth of i-AlN for the second layer 21*b* and the growth of n-GaN for the cap layer 2*d*, and thus growth interruption is caused. On the other hand, the growth pressure during the growth of i-AlGaN for the first layer 21*a* is the same as the growth pressure during the growth of AlN for the second layer 21*b*, and thus growth interruption is not caused. Therefore, even if the growth interruption is caused between the growth of AlN for the second layer 21*b* and the growth of n-GaN for the cap layer 2*d*, the surface of the first layer 21*a* is protected by the second layer 21*b* and the detachment of Ga from the first layer 21*a* is suppressed. In other words, the presence of the second layer 21*b* made of i-AlN and formed in an uppermost portion of the electron supply layer 21 so as to have a certain thickness suppresses the formation of excess high-Al-content AlGaN.

In this embodiment, since the electron supply layer 21 is an i-type layer (n-type impurity concentration: $1\times10^{17}/cm^3$ or lower), the gate leakage current is decreased as a result of the formation of the second layer 21*b*. Furthermore, a decrease in carrier density (electron density of 2 DEG) caused when the electron supply layer 21 is an i-type layer is sufficiently compensated by the second layer 21*b* made of i-AlN. This is because AlN has larger spontaneous polarization than AlGaN and also has large piezoelectric polarization due to the difference in lattice constant from GaN, which increases the density of 2 DEG induced by the electron supply layer.

In this embodiment, the second layer 21*b* is formed at a substantially uniform thickness (for example, about 1 nm) regardless of the growth conditions of the cap layer 2*d*. This provides an advantage of stably forming the electron supply layer 21. Even in this case, when the electron supply layer 21 contains an n-type impurity in a predetermined concentration or higher, a defect is formed at the interface between the first layer 21*a* and the second layer 21*b*. Therefore, the electron supply layer 21 is desirably an i-type layer (not containing an n-type impurity in a predetermined concentration or higher).

Subsequently, the steps illustrated in FIG. 1B to FIG. 2B are performed in the same manner as in the first embodiment to obtain a device illustrated in FIG. 10B. Then, for example, a step of forming a wiring layer connected to the source electrode 4, the drain electrode 5, and the gate electrode 7 is performed to form an AlGaN/GaN HEMT according to this embodiment.

This embodiment provides, using a relatively simple structure, a highly reliable AlGaN/GaN HEMT with high breakdown voltages in which both the current collapse and gate leakage current are suppressed with certainty.

The AlGaN/GaN HEMT according to the first embodiment, the second embodiment, or the modification is applied to so-called "discrete packages".

In the discrete package, a chip of the AlGaN/GaN HEMT according to the first embodiment, the second embodiment, or the modification is mounted. Hereafter, a discrete package of a chip of the AlGaN/GaN HEMT according to the first embodiment, the second embodiment, or the modification (hereafter referred to as a "HEMT chip") will be described as an example.

Figure 12:
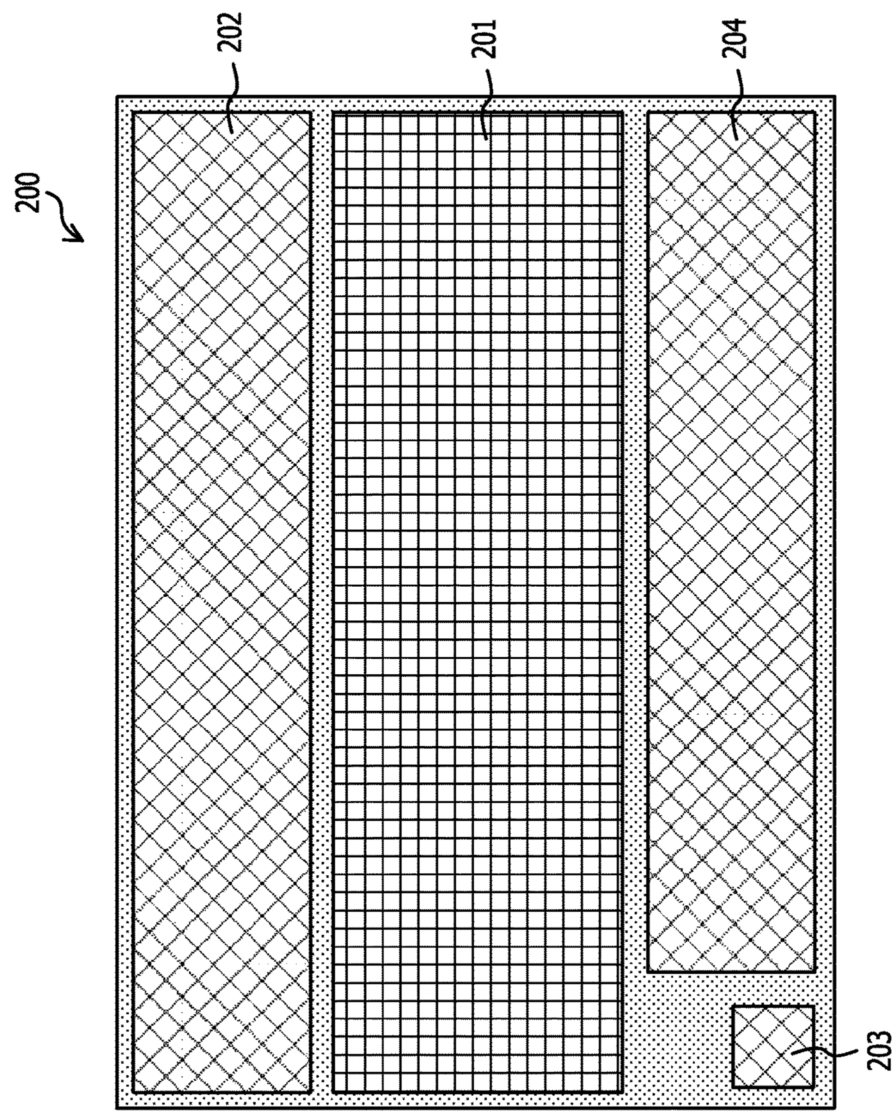
FIG. 12 is a schematic plan view illustrating a HEMT chip that uses the AlGaN/GaN HEMT according to the first embodiment, the second embodiment, or the modification.

FIG. 12 illustrates a schematic structure of the HEMT chip.

In a HEMT chip 200, a transistor region 201 of the above-described AlGaN/GaN HEMT, a drain pad 202 to which a drain electrode is connected, a gate pad 203 to which a gate electrode is connected, and a source pad 204 to which a source electrode is connected are formed on the surface of the HEMT chip 200.

Figure 13:
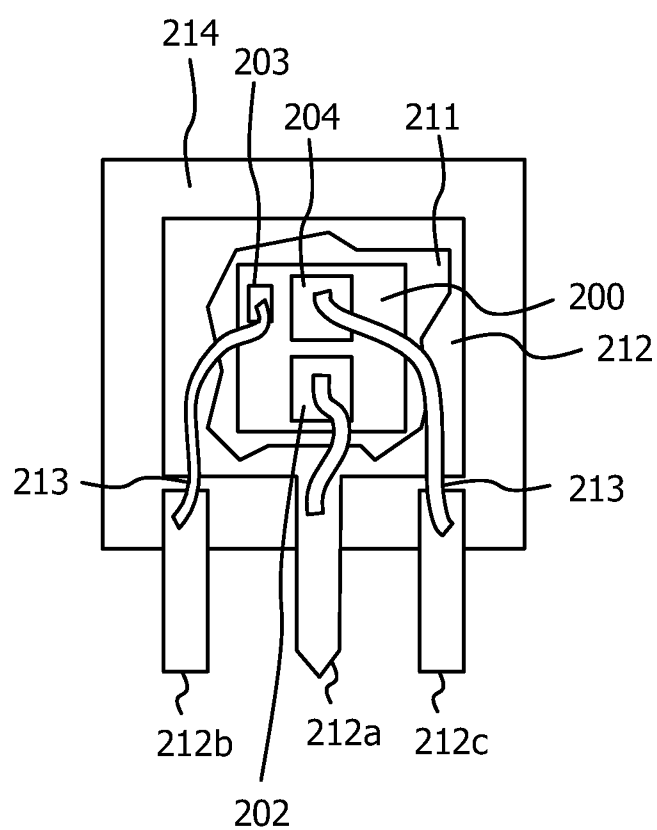
FIG. 13 is a schematic plan view illustrating a discrete package of the HEMT chip that uses the AlGaN/GaN HEMT according to the first embodiment, the second embodiment, or the modification.

FIG. 13 is a schematic plan view illustrating a discrete package.

In the production of the discrete package, first, the HEMT chip 200 is fixed onto a lead frame 212 using a die attach agent 211 such as solder. The lead frame 212 and a drain lead 212*a* are integrally formed, and agate lead 212*b* and a source lead 212*c* are formed as separated bodies away from the lead frame 212.

Subsequently, the drain pad 202 and the drain lead 212*a*, the gate pad 203 and the gate lead 212*b*, and the source pad 204 and the source lead 212*c* are each electrically connected by performing bonding that uses an Al wire 213.

Then, the HEMT chip 200 is resin-sealed by a transfer molding process using a mold resin 214, and the lead frame 212 is separated. Thus, a discrete package is formed.

Third Embodiment

This embodiment discloses a power factor correction (PFC) circuit including one AlGaN/GaN HEMT selected from the AlGaN/GaN HEMTs according to the first embodiment, the second embodiment, and the modification.

Figure 14:
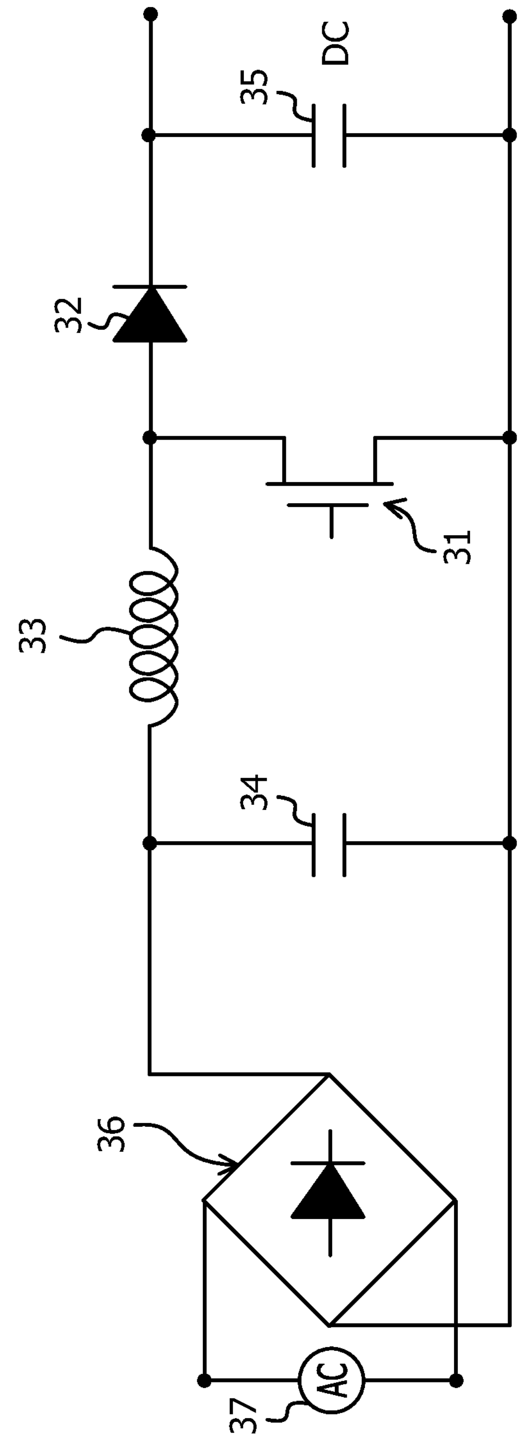
FIG. 14 is a connection diagram illustrating a power factor correction (PFC) circuit according to a third embodiment.

FIG. 14 is a connection diagram illustrating a PFC circuit.

A PFC circuit 30 includes a switching element (transistor) 31, a diode 32, a choke coil 33, capacitors 34 and 35, a diode bridge 36, and an alternating-current (AC) power supply 37. An AlGaN/GaN HEMT selected from the AlGaN/GaN HEMTs according to the first embodiment and the second embodiment is applied to the switching element 31.

In the PFC circuit 30, a drain electrode of the switching element 31 is connected to the anode terminal of the diode 32 and one terminal of the choke coil 33. A source electrode of the switching element 31 is connected to one terminal of the capacitor 34 and one terminal of the capacitor 35. The other terminal of the capacitor 34 is connected to the other terminal of the choke coil 33. The other terminal of the capacitor 35 is connected to the cathode terminal of the diode 32. The alternating-current power supply 37 is connected across the terminals of the capacitor 34 through the diode bridge 36. A direct-current (DC) power supply is connected across the terminals of the capacitor 35. A PFC controller (not illustrated) is connected to the switching element 31.

In this embodiment, one AlGaN/GaN HEMT selected from the AlGaN/GaN HEMTs according to the first embodiment, the second embodiment, and the modification is applied to the PFC circuit 30. Thus, a highly reliable PFC circuit 30 is provided.

Fourth Embodiment

This embodiment discloses a power supply device including one AlGaN/GaN HEMT selected from the AlGaN/GaN HEMTs according to the first embodiment, the second embodiment, and the modification.

Figure 15:
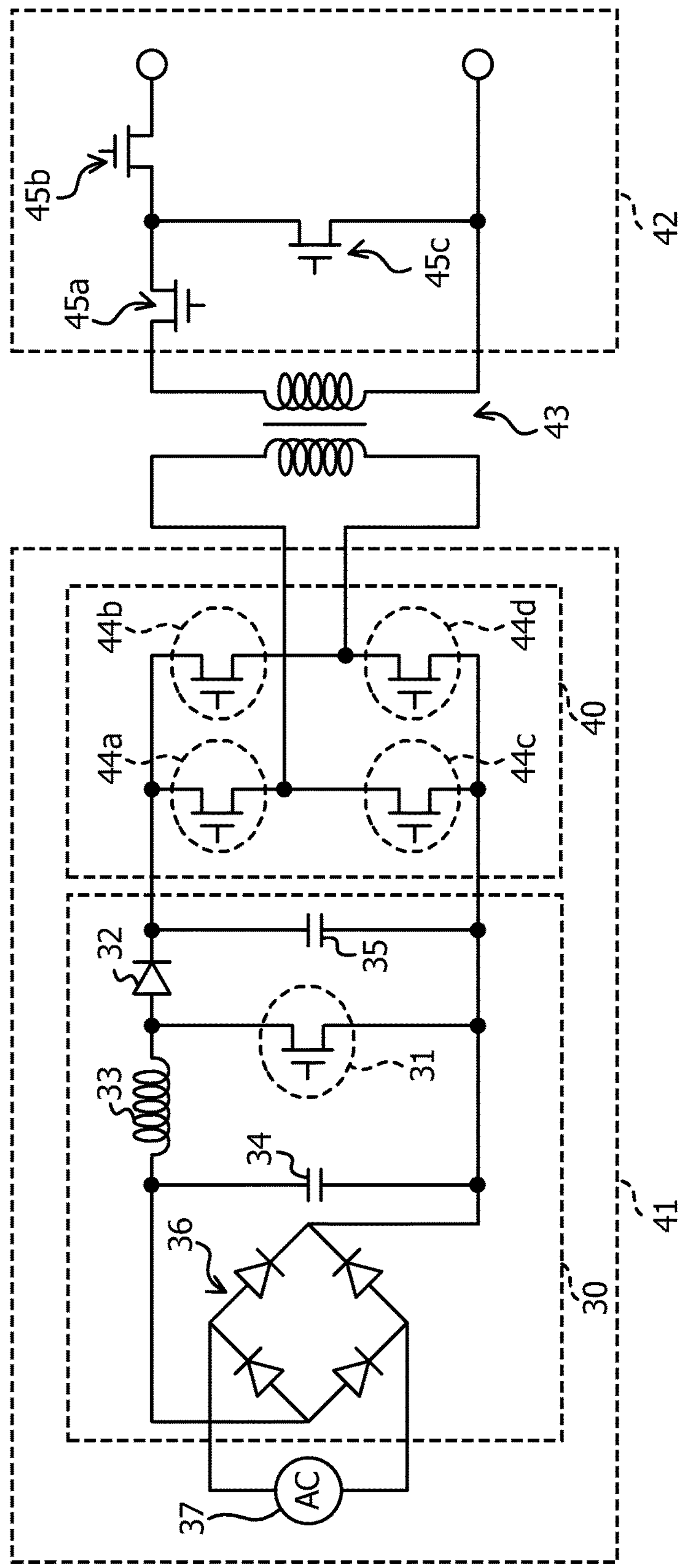
FIG. 15 is a connection diagram illustrating a schematic structure of a power supply device according to a fourth embodiment.

FIG. 15 is a connection diagram illustrating a schematic structure of a power supply device according to a fourth embodiment.

The power supply device according to this embodiment includes a high-voltage primary circuit 41, a low-voltage secondary circuit 42, and a transformer 43 formed between the primary circuit 41 and the secondary circuit 42.

The primary circuit 41 includes the PFC circuit 30 according to the third embodiment and an inverter circuit connected across the terminals of the capacitor 35 of the PFC circuit 30, such as a full-bridge inverter circuit 40. The full-bridge inverter circuit 40 includes a plurality of (herein, four) switching elements 44*a*, 44*b*, 44*c*, and 44*d*.

The secondary circuit 42 includes a plurality of (herein, three) switching elements 45*a*, 45*b*, and 45*c*.

In this embodiment, the PFC circuit constituting the primary circuit 41 is the PFC circuit 30 according to the third embodiment, and the switching elements 44*a*, 44*b*, 44*c*, and 44*d* of the full-bridge inverter circuit 40 are each one AlGaN/GaN HEMT selected from the AlGaN/GaN HEMTs according to the first embodiment, the second embodiment, and the modification. The switching elements 45*a*, 45*b*, and 45*c* of the secondary circuit 42 are each a typical MISFET that uses silicon.

In this embodiment, the PFC circuit 30 according to the third embodiment and one AlGaN/GaN HEMT selected from the AlGaN/GaN HEMTs according to the first embodiment, the second embodiment, and the modification are applied to the high-voltage primary circuit 41. Thus, a highly reliable, high-power power supply device is provided.

Fifth Embodiment

This embodiment discloses a high-frequency amplifier including one AlGaN/GaN HEMT selected from the AlGaN/GaN HEMTs according to the first embodiment, the second embodiment, and the modification.

Figure 16:
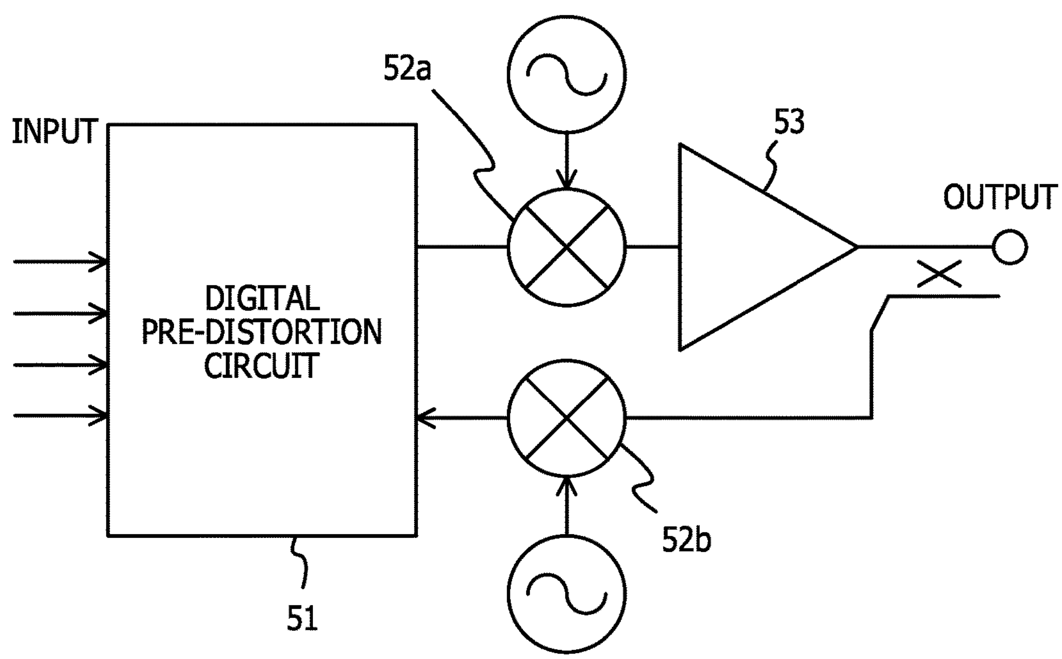
FIG. 16 is a connection diagram illustrating a schematic structure of a high-frequency amplifier according to a fifth embodiment.

FIG. 16 is a connection diagram illustrating a schematic structure of a high-frequency amplifier according to a fifth embodiment.

The high-frequency amplifier according to this embodiment includes a digital pre-distortion circuit 51, mixers 52*a* and 52*b*, and a power amplifier 53.

The digital pre-distortion circuit 51 compensates for a nonlinear distortion of an input signal. The mixer 52*a* mixes an AC signal with the input signal whose nonlinear distortion is compensated for. The power amplifier 53 amplifies the input signal that has been mixed with the AC signal and includes one AlGaN/GaN HEMT selected from the AlGaN/GaN HEMTs according to the first embodiment, the second embodiment, and the modification. In FIG. 16, an output side signal and an AC signal are made to be mixed by the mixer 52*b* and sent to the digital pre-distortion circuit 31 by, for example, switching a switch.

In this embodiment, one AlGaN/GaN HEMT selected from the AlGaN/GaN HEMTs according to the first embodiment, the second embodiment, and the modification is applied to a high-frequency amplifier. Thus, a highly reliable high-frequency amplifier with high breakdown voltages is provided.

All examples and conditional language recited herein are intended for pedagogical purposes to aid the reader in understanding the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present invention have been described in detail, it should be understood that the various changes, substitutions, and alterations could be made hereto without departing from the spirit and scope of the invention.

What is claimed is:

1. A compound semiconductor device comprising:

an electron transit layer made of GaN;

an electron supply layer formed over the electron transit layer; and a GaN cap layer formed over the electron supply layer, wherein the electron supply layer includes a first layer made of i-type $Al_xGa_{1-x}N$ ($0<x<1$) and a second layer made of i-type $Al_yGa_{1-y}N$ ($x<y\leq1$) and formed over the first layer, wherein the second layer has thickness of 2 nm or lower, and wherein a two-dimensional electron gas is generated in a portion of the electron transit layer.

2. The compound semiconductor device according to claim 1, wherein the electron supply layer has an n-type impurity concentration of $1\times10^{17}/cm^3$ or lower in an entire region in a thickness direction thereof.

3. The compound semiconductor device according to claim 2, wherein the n-type impurity concentration of the electron supply layer decreases in the thickness direction from the electron transit layer toward the GaN cap layer.

4. The compound semiconductor device according to claim 2, wherein an n-type impurity contained in the electron supply layer is Si, Ge, or Si and Ge.

5. The compound semiconductor device according to claim 1, wherein the GaN cap layer contains an n-type impurity in a concentration higher than $1\times10^{17}/cm^3$.

6. A power supply device comprising:

a high-voltage circuit; and a low-voltage circuit connected to the high-voltage circuit with a transformer formed therebetween, wherein the high-voltage circuit includes a compound semiconductor device, the compound semiconductor device includes:

an electron transit layer made of GaN, an electron supply layer formed over the electron transit layer, and a GaN cap layer formed over the electron supply layer, and wherein the electron supply layer includes a first layer made of i-type $Al_xGa_{1-x}N$ ($x<y<1$) and a second layer made of i-type $Al_yGa_{1-y}N$ ($x<y\leq1$) and formed over the first layer, wherein the second layer has a thickness of 2 nm or lower, and wherein a two-dimensional electron gas is generated in a portion of the electron transit layer.

* * * * *